United States Patent
Koorapaty et al.

(10) Patent No.: US 8,155,247 B2
(45) Date of Patent: Apr. 10, 2012

(54) MESSAGE DECODING WITH A PRIORI INFORMATION AND SOFT COMBINING

(75) Inventors: Havish Koorapaty, Cary, NC (US); Rajaram Ramesh, Cary, NC (US); Kumar Balachandran, Cary, NC (US)

(73) Assignee: Telefonaktiebolaget L M Ericsson (Publ), Stockholm (SE)

( * ) Notice: Subject to any disclaimer, the term of this patent is extended or adjusted under 35 U.S.C. 154(b) by 1091 days.

(21) Appl. No.: 12/063,997

(22) PCT Filed: Aug. 16, 2005

(86) PCT No.: PCT/SE2005/001216
§ 371 (c)(1), (2), (4) Date: Feb. 15, 2008

(87) PCT Pub. No.: WO2007/021224
PCT Pub. Date: Feb. 22, 2007

(65) Prior Publication Data
US 2008/0240305 A1    Oct. 2, 2008

(51) Int. Cl.
*H04L 27/06* (2006.01)
(52) U.S. Cl. .................................................. 375/341
(58) Field of Classification Search .............. 375/340, 375/341, 324, 342, 346; 714/755, 758, 190, 714/788, 786
See application file for complete search history.

(56) References Cited

U.S. PATENT DOCUMENTS

| | | | | |
|---|---|---|---|---|
| 5,511,081 A * | 4/1996 | Hagenauer | .................... | 714/795 |
| 6,292,922 B1 * | 9/2001 | Ruscitto et al. | ............... | 714/795 |
| 6,608,828 B1 * | 8/2003 | Balachandran | ............... | 370/349 |
| 6,973,614 B1 * | 12/2005 | Hagenauer et al. | ........... | 714/786 |
| 7,200,795 B2 * | 4/2007 | Stek et al. | ..................... | 714/776 |
| 2002/0118744 A1 * | 8/2002 | Park | ......................... | 375/240.02 |
| 2002/0178418 A1 * | 11/2002 | Ramprashad et al. | ........ | 714/755 |
| 2003/0072394 A1 * | 4/2003 | Molnar | .......................... | 375/340 |

* cited by examiner

*Primary Examiner* — Jaison Joseph (57) ABSTRACT

A method and arrangement for improving channel decoding performance in a radio receiver. Data bits from previously decoded messages are analyzed to provide a priori information to a channel decoder which is decoding a currently received message of the same type. The invention may analyze both the header and data fields of the previously decoded message frames to detect fields that are unchanging or rarely changing from one frame to the next. Probabilistic knowledge (a) of the bits in these unchanging or rarely changing fields is then used to improve the decoding performance for the current message. If a message cannot be successfully decoded, soft values of the bits are stored and then soft-combined with selected bits in the next message received prior to decoding. The invention is applicable to any type of message that has data components that are repeated with varying degrees of probability in successive transmissions.

27 Claims, 4 Drawing Sheets

MESSAGE DECODING WITH A PRIORI INFORMATION AND SOFT COMBINING

TECHNICAL FIELD OF THE INVENTION

The present invention relates generally to radio communication networks. More particularly, and not by way of limitation, the present invention is directed to a method and arrangement for improving channel decoding performance in a radio receiver.

DESCRIPTION OF RELATED ART

Digital wireless communication systems typically have a framed transmission structure with control messages being transmitted in each frame. The control messages describe various system parameters that are essential for mobile station operation in the system. When a mobile station is distant from its serving base station or is experiencing high levels of interference, the mobile station may not be able to successfully demodulate and decode the control messages. This impedes the operation of the mobile station and may result in an outage (i.e., a loss in connectivity with the base station).

Prior solutions for improving decoding performance for control messages have defined new coding modes for disadvantaged users with low carrier-to-interference and noise ratios (CINR). Such coding modes include a repetition method and a low rate coding method in the communication protocol between the mobile station and base stations when users with low CINR values are to be accommodated. (See, for example, U.S. Pat. No. 6,823,173 and U.S. Pat. No. 6,405,039). Another example is U.S. Pat. No. 6,130,915, which describes repetition of digital program broadcasts to reach users who may have low CINR. Other solutions have focused on demodulation of correlated sources such as audio and video, but not for the problem of control message demodulation. U.S. Pat. No. 6,608,828 (Balachandran) proposes an approach in which knowledge of repeated components of headers in data messages is utilized to improve decoding performance. Balachandran, however, only utilizes information in the headers, and probabilistic knowledge of bits in other parts of the messages is not considered.

Generally, prior solutions for improving connectivity in radio communication networks, by improving the performance of control message demodulation, require active involvement of the transmitter to add new coding modes specifically for the purpose of reaching a disadvantaged user. It would be advantageous to have a method and arrangement for further improving channel decoding performance, which resides strictly in the radio receiver and does not require involvement of the transmitter. The present invention provides such a method and arrangement.

SUMMARY OF THE INVENTION

The present invention is a method and arrangement for improving channel decoding performance in a radio receiver. The invention analyzes data bits from previously decoded messages to provide a priori information to a channel decoder, which is decoding a currently received message of the same type. The invention may analyze both the header and data fields of the previously decoded messages to detect fields that are unchanging or rarely changing from one frame to the next. Probabilistic knowledge of the bits in these unchanging or rarely changing fields is then used to improve the decoding performance for the current message. If a message cannot be successfully decoded, soft values of the bits are stored and then soft-combined with selected bits in the next message received. In the preferred embodiment described herein, the messages are control messages, but the invention is applicable to any type of message that has data components that are repeated with varying degrees of probability in successive transmissions.

Thus, in one aspect, the present invention is directed to a method in a radio receiver of decoding an encoded message of a given type received in a current frame. The method includes determining whether messages of the given type were previously received and successfully decoded. If messages of the given type were previously received and successfully decoded, data bits from the previously received and decoded messages are analyzed to identify deterministic data bits having expected bit values that are determinable in the currently received message based on the decoded values of the bits in the previously received messages. The currently received message is then decoded utilizing knowledge of the expected bit values of the identified deterministic data bits.

This aspect may also include analyzing the data bits from the previously received and decoded messages to identify probabilistic bits having expected bit values that are predictable in each subsequently received message with a high, but not absolute, degree of certainty. Values of the probabilistic bits for the currently received message are then predicted, and the currently received message is decoded utilizing the knowledge of the expected bit values of the identified deterministic data bits together with knowledge of the predicted values of the identified probabilistic bits.

In another aspect, the present invention is directed to an arrangement in a radio receiver for decoding a frame of a currently received encoded message of a given type. The arrangement includes means for determining whether frames of the given type were previously received and successfully decoded, and means, responsive to a determination that messages of the given type were previously received and successfully decoded, for analyzing data bits from the previously received and decoded messages to identify deterministic data bits having expected bit values that are determinable in the currently received message based on the decoded values of the bits in the previously received messages. A decoder then decodes the currently received message utilizing knowledge of the expected bit values of the identified deterministic data bits.

In this aspect, the means for analyzing the data bits from the previously received and decoded frames may also include means for identifying probabilistic bits having expected bit values that are predictable in each subsequently received message with a high, but not absolute, degree of certainty. The arrangement may further comprise means for predicting values of the probabilistic bits for the currently received message. In this aspect, the decoder decodes the currently received message utilizing the knowledge of the expected bit values of the identified deterministic data bits together with knowledge of the predicted values of the identified probabilistic bits.

DETAILED DESCRIPTION OF EMBODIMENTS

The present invention is a method and arrangement for improving channel decoding performance in a radio receiver. The invention analyzes data bits from previously decoded messages to provide a priori information to a channel decoder, which is decoding a currently received message of the same type. The invention may analyze both the header and data fields of the previously decoded frames to detect fields that are unchanging from one frame to the next, fields that change in a determinable way, or fields that change in a less determinable way, but rarely do so. Probabilistic knowledge of the bits in these unchanging, determinably changing, or rarely changing fields is then used to improve the decoding performance for the current message. If a frame cannot be successfully decoded, soft values of the bits are stored and then soft-combined with selected bits in the next frame received. In the preferred embodiment described herein, the messages are control messages, but the invention is applicable to any type of message that has data components that are repeated with varying degrees of probability in successive transmissions.

In the embodiments described herein, the transmitter does not send any extra repeated signals specifically for disadvantaged users. The receiver improves decoding performance purely through receiver operations. This mode of operation enables a mobile station in a wireless communication system to extend its connectivity beyond that provided by system design and without any change to base station or system operation. When the user is noise-limited, the invention enables the disadvantaged user to operate at greater distances from the base station. When the user is interference-limited, the invention enables the disadvantaged user to maintain connectivity in a harsh radio environment.

In any wireless communication system, there is redundancy in both the header fields and the data fields of the control messages. In other words, many bits in a control message remain the same or change in predictable patterns across many frames. The present invention uses knowledge of these highly correlated control message bits to improve control message decoding. The invention is described herein in the context of IEEE 802.16. However, this is exemplary only, and it is to be understood that the invention may be applied to any multiple-access wireless communication system.

Figure 1:
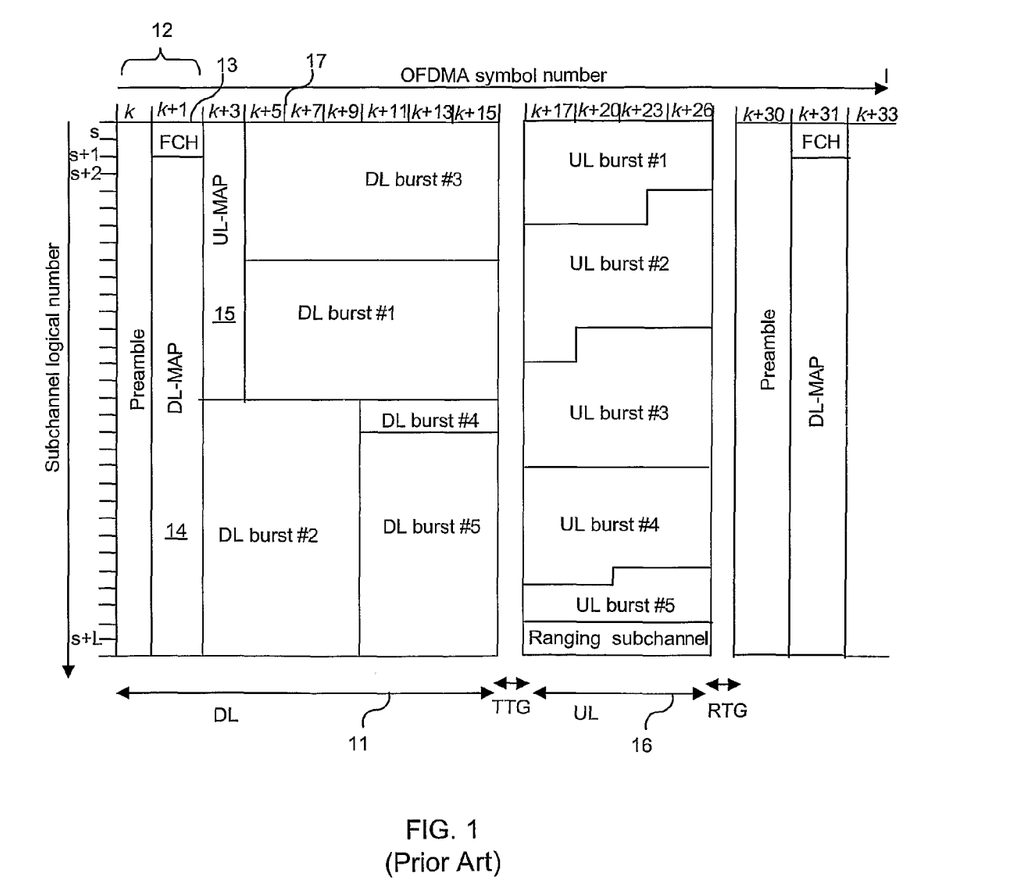
FIG. 1 (Prior Art) is an illustrative drawing of the existing IEEE 802.16 frame structure for a time-division-duplex (TDD) configuration showing the orthogonal frequency division multiple access (OFDMA) physical layer (PHY)

FIG. 1 is an illustrative drawing of the existing IEEE 802.16 frame structure for a time-division-duplex (TDD) configuration showing the orthogonal frequency division multiple access (OFDMA) physical layer (PHY). A downlink subframe 11 starts with a frame control section 12 that includes a frame control header (FCH) 13, a downlink mobile application part (DL-MAP) 14 for the current downlink frame, and an uplink mobile application part (UL-MAP) 15 for a specified uplink frame 16 in the future. The downlink subframe typically contains a section for data transmission 17 immediately following the frame control section.

FIG. 1 shows transmission of the FCH, DL-MAP, and UL-MAP control messages once every frame. The control messages are hierarchically structured, and the FCH message must be read correctly before the other parts of the transmitted frame can be read. The FCH encapsulates a downlink frame prefix. The DL-MAP contains information on burst allocations to mobile stations being served by the base station on the downlink, while the UL-MAP similarly describes burst allocations on the uplink.

The DL-MAP and UL-MAP messages may be encoded with coding rates as low as 1/12 (rate-1/2 with 6 repetitions) and with turbo-codes codes or some other coding scheme such as convolutional codes. The FCH is encoded using a tail-biting convolutional code with a lowest rate of 1/8 (rate-1/2 with four repetitions). The FCH encapsulates only one message, which is the downlink frame prefix. The FCH message contains the following six elements:

1. A group of 6 bits with each bit representing a group of subchannels. The bits are set to one (1) if any subchannel of the subchannels in the corresponding group is occupied within the frame. Otherwise, the bits are set to zero (0).
2. A ranging change indication bit that indicates if the ranging mechanism has changed from prior frames.
3. Two bits indicating the repetition mode (0, 2, 4 or 6 repeats) being used for the DL-MAP control message in the frame.
4. Three bits indicating the coding mode used on the DL-MAP.
5. Eight bits indicating the length of the DL-MAP.
6. Four reserved bits, which are set to zero (0).

It can be seen from the above list of elements that the only bits that are likely to change often are the first group of bits indicating subchannel occupancy and the set of eight bits indicating the length of the DL-MAP. Among these, the first group indicating subchannel occupancy could remain constant for many frames while the DL-MAP length may vary on a frame-by-frame basis.

The DL-MAP message contains the following five elements:

1. Eight bits indicating the message type.
2. A PHY synchronization field that contains:
   a. Frame length
   b. Frame number
3. Eight bits that indicate whether the mapping of burst profiles to a four-bit code (downlink interval usage code) has been updated. The eight-bit value is incremented for each new configuration.
4. Forty-eight bits indicating the base station ID.
5. DL-MAP information elements (IE) for each of the bursts in the frame.

In the above list of elements, the first field indicating message type never changes. In the PHY synchronization field, the frame length will rarely change, and the frame number is predictable because it is incremented by one every frame. The eight bits indicating a configuration change and the 48 bits indicating base station ID also rarely change. The last set of DL-MAP information elements could change on a frame-by-frame basis.

Thus, in the above two important control messages, there are numerous data fields that either remain the same or change in deterministic ways from frame-to-frame. There are some fields that change with a very low probability. As in the above two examples, these observations hold true for many control messages in any wireless communication system. The high degree of correlation or constancy of message elements from frame to frame provides the receiver with a great deal of useful information from past frames when trying to decode control messages in the current frame.

Figure 2:
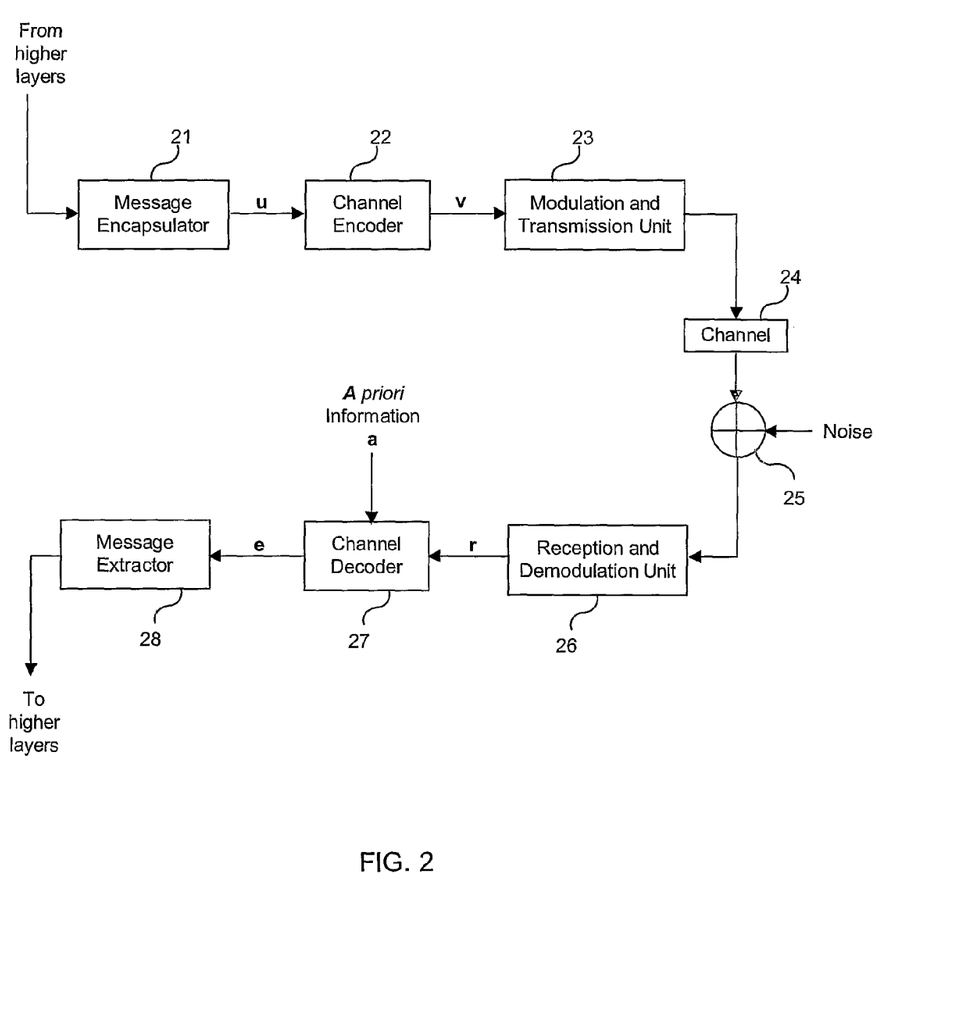
FIG. 2 is a simplified functional block diagram of an embodiment of a coding and decoding arrangement in a wireless communication system according to the present invention.

FIG. 2 is a simplified functional block diagram of an embodiment of a coding and decoding arrangement in a wireless communication system according to the present invention. The control messages of interest are received from higher layers, and a message encapsulator 21 encapsulates the messages in the correct physical layer formats. A channel encoder 22 then encodes the messages. Many different coding methods exist for providing redundancy and improving link performance. Convolutional codes, turbo codes, low-density parity-check codes, and Reed-Solomon codes are some, examples of such codes. The input to the encoder is represented by the vector, u. The output of the channel encoder is represented by the vector, v, and is sent to a modulation and transmission unit 23 where it is modulated and transmitted over the wireless channel 24. During transmission and reception, some amount of noise is added to the signal at 25.

A reception and demodulation unit 26, for example at a mobile terminal, receives and demodulates the signal in the presence of the additive noise. The demodulated signal is represented by the vector, r, and is input to a channel decoder 27. The channel decoder in the present invention uses a priori information, a, gained from previously received frames to improve decoding performance. The channel decoder outputs an estimate represented by the vector, e, of the encapsulated message, u, and provides it to a message extractor 28. The extracted message is then passed to higher layers.

The channel decoder 27 may utilize any a priori information regarding the transmitted message, u, to generate the estimate, e. If maximum-likelihood sequence decoding is used, the optimal decoder chooses the estimate, e, that maximizes the joint probability, p(r, e), which is calculated as p(r, e)=p(r|e)·p(e). This is the probability that the sequence, r, was received and that the message, e, was transmitted. The maximization is carried out over all possible sequences. If decoding is achieved without errors, then e=u. The probability p(e) is simply the a priori probability that e was transmitted. This information for a given message sequence, where the bits in the sequence are independent of each other, can be obtained as the product $p(e_1) \cdot p(e_2) \ldots p(e_n)$, where $p(e_i)$ is the probability that the ith transmitted bit, $u_i=e_i$. Hence, the a priori information for all possible transmitted message sequences can be obtained from the vector $a=[p(u_1=0) \ p(u_2=0) \ldots p(u_n=0)]$. The probabilities, $p(u_i=1)$, can simply be obtained as $p(u_i=1)=1-p(u_i=0)$.

In most cases, all input sequences to the channel decoder 27 are considered to be equally likely. In other words no a priori information, such as the vector, a, is assumed to be available. However, if such information is available, then decoding performance can be improved. In the following sections, methods to exploit this information in the receiver are described.

The following set of rules applies to the invention:
1. When a control message has been successfully decoded, and it is known that bits in the frame will remain unchanged for some future frame, the a priori information for the unchanging bits is set to 1. That is, $p(u_i=1)=1$ if the ith bit in the message is known to be equal to 1, and $p(u_i=0)=1$ if the ith bit in the message is equal to 0. An example of such bits in the IEEE 802.16 system are the eight bits indicating the message type in the DL-MAP message 14 (FIG. 1) and the 48 bits indicating the base station ID in the downlink frame prefix message in the FCH 13.
2. When a control message is currently being decoded, and it is known that this message has been successfully decoded in the past, and it is known that bits in the frame change in some deterministic fashion, then the a priori information for the deterministic bits are set to 1 for the expected bit values at the current time. An example of such bits in a message is the frame number bits in the DL-MAP message 14 in IEEE 802.16 systems. The frame number is incremented every frame. Hence, the current frame number can be obtained by recording in memory the time at which a past frame was decoded and the corresponding frame number, and calculating the number of elapsed frames between the current time and the recorded time.
3. When a control message is currently being decoded, and it is known that this message has been successfully decoded in the past, and it is known that some bits in the frame have a very low (or a very high) probability of changing, then the a priori information for these probabilistic bits is set according to one of the following two methods:
   a. The a priori information is set to some arbitrary high (or low) number (for example 0.9 or 0.1), biased towards (or against) the values decoded in the previous control message. That is, if bit $u_i=1$ when the message was successfully decoded in the past, and the bit has a low probability of, changing, then the a priori information for bit $u_i$ at the current time is set as $p(u_i=1)=0.9$. Conversely, if the bit has a high probability of changing, then the a priori information for bit $u_i$ at the current time is set as $p(u_i=1)=0.1$.
   b. The probability of these bits changing is measured over time using, for example, a sliding window of a pre-defined number of frames (e.g., 100 frames). The a priori probability is set accordingly. This method requires storing a vector, the size of which is determined by the number of control messages being regularly decoded and the number of such bits that exhibit a low or high probability of change.

For all remaining bits that do not fall into any of these categories, a priori information is assumed to be unavailable, and the a priori probabilities are set to 0.5. If decoding using the above a priori information is not successful, decoding is performed with all a priori values set to 0.5 for bits with a very low probability of changing. That is, no assumption of a priori knowledge is made for these bits. This procedure is followed because these bits might have changed for this particular transmission of the control message. If the decoding is still not successful, all a priori values are set to 0.5 and then decoding is attempted.

It should also be understood that when the description herein refers to an a priori probability, the invention may also utilize any similar likelihood measure such as, for example, the logarithm of the a priori probability. Additionally, setting the a priori probability to a high number may involve setting the a priori probability of an expected bit value to a level indicating that the expected bit value is more likely than not to be accurate. Thus, the a priori probability of an expected bit value may be set to a level between 0.5 and 1.0. Of course, the invention may also achieve this result by setting the a priori probability of the opposite bit value between 0 and 0.5. Similarly, the setting of the a priori probability of an expected bit value to 1.0 is equivalent to setting the probability for the opposite bit value to 0.

In addition to the above methods for the provision of a priori probabilities, the present invention also provides improved message decoding when it is known that certain encoded bits (for example, bits in the vector, v, in FIG. 2), will remain unchanged or change predictably from frame-to-frame, but the values of these bits are not known because the control message has not been decoded successfully in the recent past. This could be the case, for example, whenever convolutional codes are used and a, number of contiguous bits of length more than twice that of the memory of the code are known to be unchanged. The downlink frame prefix message on the FCH in 802.16 systems is such a case. Here, the first 6 bits and the last 8 bits of the message may change unpredictably, with the first 6 bits much less likely to change than the last six bits. However, the remaining bits in the message do not change. Hence, there is a segment of 30 bits in between the first and last elements that is highly unlikely to change. Since the convolutional code used on the FCH uses a memory of 6, a set of 6 bits on either side of this segment must be discarded to determine the set of encoded bits that will remain unchanged. The number of unchanged encoded bits is (30-2·(m-1))/R, where m is the memory size of the code and R is the rate. Here, m=6 and R=1/2. Therefore, the number of unchanged bits is 40.

In accordance with the present invention, the demodulated values from the vector r in FIG. 2 corresponding to these 40 bits are stored after each attempt at decoding the message. In each decoding attempt, the soft values from the currently received vector are combined with the ones previously stored and then input to the decoder. This is known as soft combining and further improves the probability that the message will be decoded correctly. When bits change predictably, the soft values are combined after toggling the sign of the values according to the predicted changes.

Figure 3A:
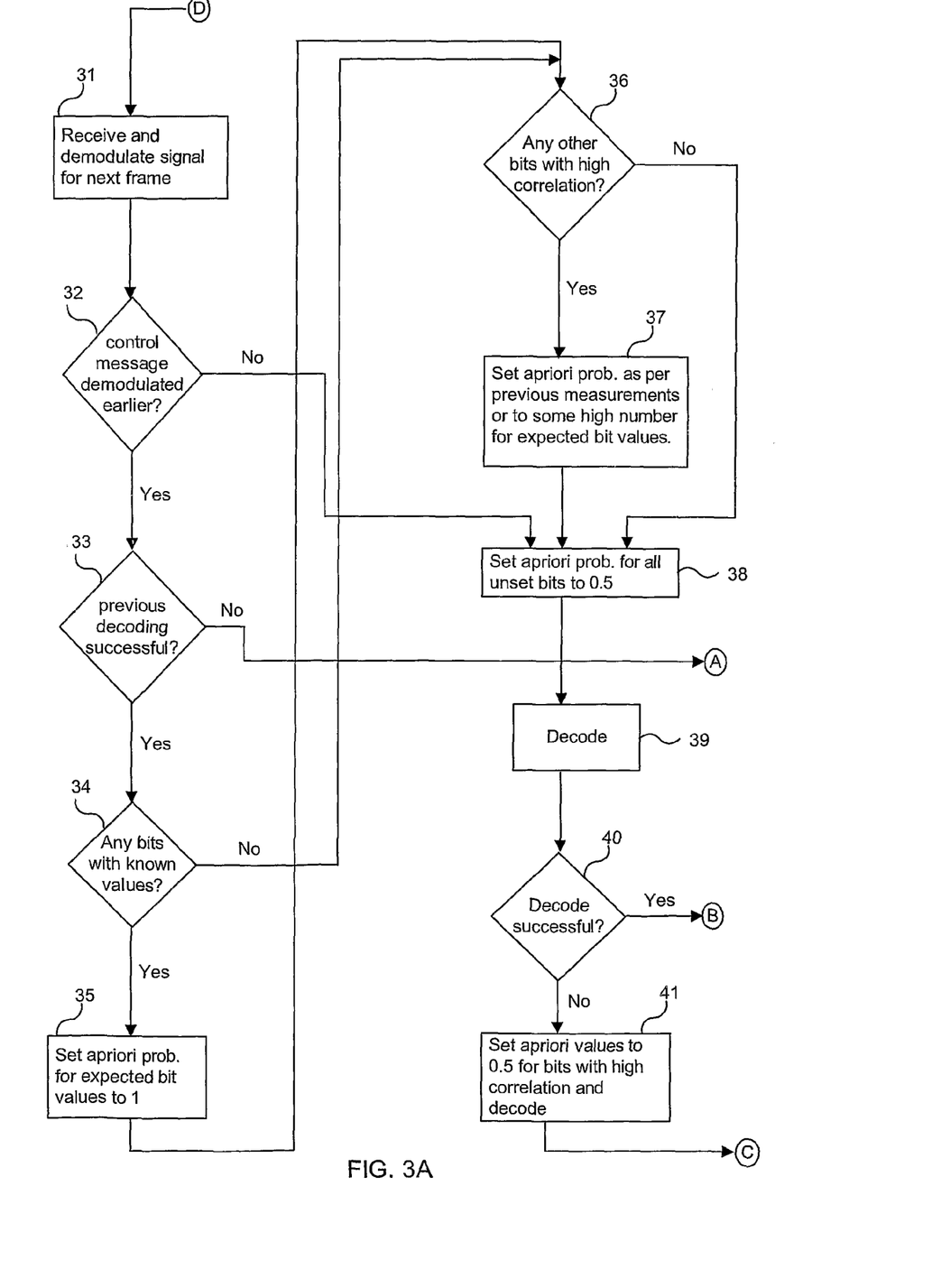
FIGS. 3A and 3B are portions of a flow chart illustrating the steps of exemplary embodiments of the method of the present invention.
Figure 3B:
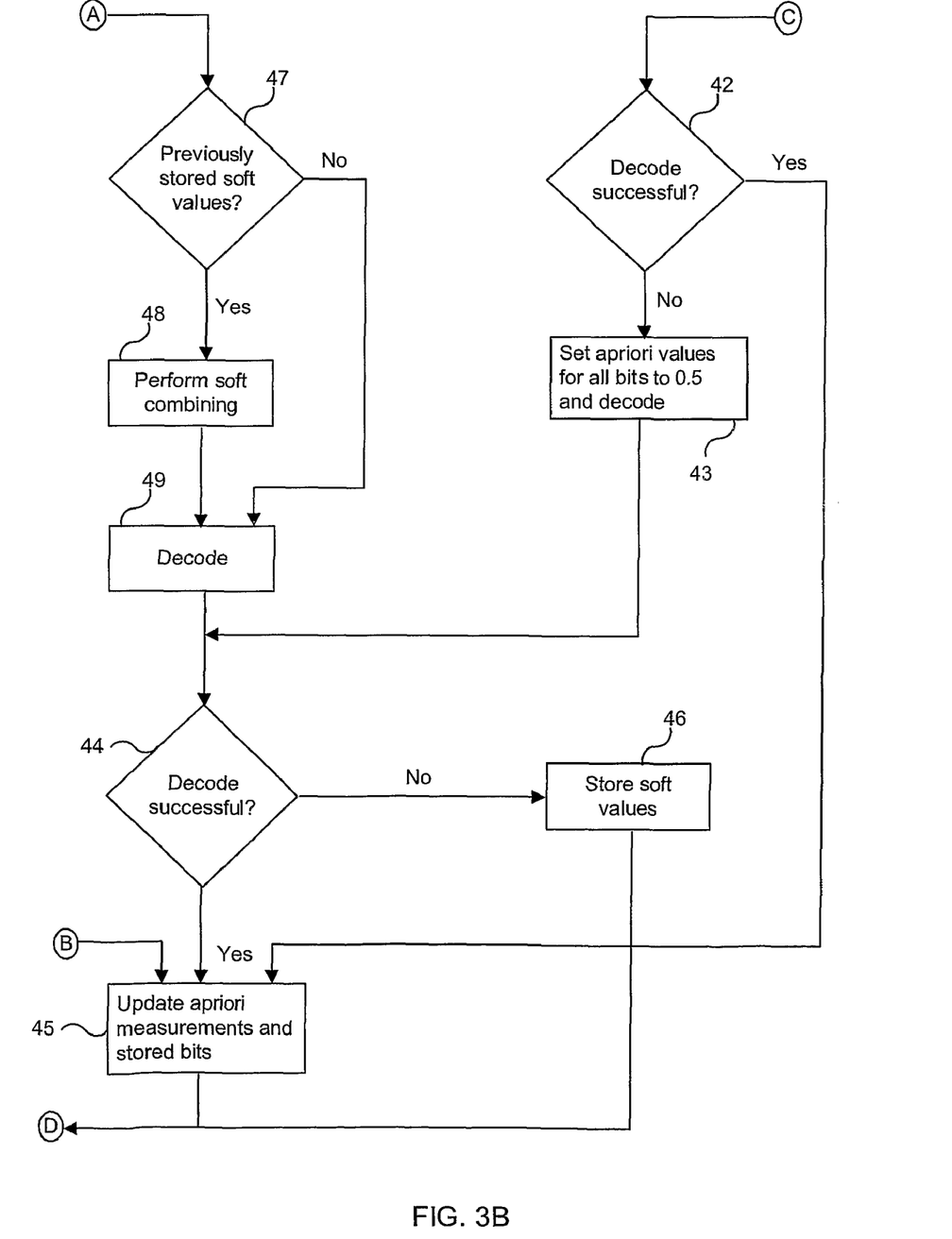

FIGS. 3A and 3B are portions of a flow chart illustrating the steps of an exemplary embodiment of the method of the present invention. Referring first to FIG. 3A, the process starts at step 31 where a signal for a next frame is received and demodulated. At step 32, it is determined whether a message of this type (for example, a control message) was demodulated earlier. If not, the process moves ahead to step 38 where the a priori probability for all unset bits is set to 0.5 (or approximately 0.5). However, if a control message was demodulated earlier, the process moves from step 32 to step 33 where it is determined whether a previous decoding of the signal was successful. If not, the process moves ahead to step 47 in FIG. 3B. However, if the previous decoding of the signal was successful, the process moves from step 33 to step 34 where it is determined whether there are any deterministic bits with known values (i.e., unchanging or predictable from previous decodings). If not, the process moves ahead to step 36. However, if there are any bits with known values, the process moves from step 34 to step 35 where the a priori probability for the expected bit value of each deterministic bit is set to 1.0.

The process then moves to step 36 where it is determined whether there are any other bits with high correlation (i.e., probabilistic bits having expected bit values that are predictable in each subsequently received message with a high, but not absolute, degree of certainty). If not, the process moves ahead to step 38. However, if there are any probabilistic bits with high correlation, the process moves from step 36 to step 37 where the a priori probability for the bit values with high correlation is set as per previous measurements or to a high probability greater than 0.5 and less than 1.0 (for example, 0.9). At step 38, the a priori probability for all remaining unset bits is set to 0.5 (or approximately 0.5). At step 39, the channel decoder then attempts to decode the received and demodulated signal using the a priori information.

At step 40, it is determined whether the decoding was successful. If so, the process moves ahead to step 45 where the a priori measurements and stored bits are updated. However, if the decoding was not successful, the process moves from step 40 to step 41 where the a priori probability is set to 0.5 (or approximately 0.5) for the probabilistic bits with high correlation, and then the decoding is attempted again. The process then moves to step 42 of FIG. 3B.

Referring now to FIG. 3B, it is determined at step 42 whether the second decoding attempt (step 41) was successful. If so, the process moves ahead to step 45 where the a priori measurements and stored bits are updated. The process then returns to step 31 of FIG. 3A where the signal for the next frame is received and demodulated. However, if the decoding was not successful, the process moves from step 42 to step 43 where the a priori probability is set to 0.5 (or approximately 0.5) for all bits, and then the decoding is attempted again. At step 44, it is determined whether the third decoding attempt (step 43) was successful. If so, the process moves to step 45 where the a priori measurements and stored bits are updated. However, if the decoding was not successful, the process moves from step 44 to step 46 where the soft values from the demodulated vector, r, are stored. The process then returns to step 31 of FIG. 3A where the signal for the next frame is received and demodulated.

This time, when the process reaches step 33, and it is determined that the previous decoding was not successful, the process moves to step 47 of FIG. 3B where it is determined whether there are any previously stored soft values. If so, the process moves to step 48 where the values of selected bits from the currently received vector are soft-combined with the previously stored soft values (step 46). As noted above, the selected bits may be a bit segment in which the values of the bits are known to be unchanging or determinably changing from frame-to-frame, but the bit values themselves are not known. The signal is then input to the decoder at step 49. If there were no previously stored soft values, the process moves directly from step 47 to step 49. The process then continues from step 44 as previously described.

Those skilled in the art will readily appreciate that the present invention may be implemented using either hardware, or software, or both, and further, software implementations may vary using different languages and data structures. The present invention is not limited to a specific language and/or class of languages, nor is it limited to any single data structure implantation.

The present invention may of course, be carried out in other specific ways than those herein set forth without departing from the essential characteristics of the invention. The present embodiments are, therefore, to be considered in all respects as illustrative and not restrictive, and all changes coming within the meaning and equivalency range of the appended claims are intended to be embraced therein.

The invention claimed is:

1. A method in a radio receiver of decoding an encoded message of a given type received in a current frame, said method comprising:
   determining whether messages of the given type were previously received and successfully decoded;
   if messages of the given type were previously received and successfully decoded, analyzing data bits from header and data fields of the previously received and decoded messages to identify deterministic data bits having expected bit values that are determinable in the currently received message based on the decoded values of the bits in the previously received messages, said deterministic data bits including both consistent data bits, wherein each consistent data bit has a value that is unchanging in each of the previously received messages, and predictable data bits, wherein each predictable data bit has a value that changes in each subsequently received message in a predictable manner; and
   decoding the currently received message utilizing knowledge of the expected bit, values of the identified deterministic data bits.

2. The method of claim 1, further comprising prior to decoding the currently received message, the step of setting a likelihood measure for an expected bit value for each of the deterministic data bits to a level indicating absolute certainty for the expected bit value for each of the deterministic data bits.

3. The method of claim 2, wherein the step of setting a likelihood measure for an expected bit value for each of the deterministic data bits includes setting to 1.0, an a priori probability for an expected bit value for each of the deterministic data bits.

4. The method of claim 3, further comprising:
analyzing the data bits from the previously received and decoded messages to identify probabilistic bits having expected bit values that are predictable in each subsequently received message with a high, but not absolute, degree of certainty; and
predicting values of the probabilistic bits for the currently received message,
wherein each predictable data bit has a value that chanqes in each subsequently received message in a predictable manner; and
wherein the step of decoding the currently received message includes decoding the currently received message utilizing the knowledge of the expected bit values of the identified deterministic data bits together with knowledge of the predicted values of the identified probabilistic bits.

5. The method of claim 4, further comprising prior to decoding the currently received message, the step of setting a likelihood measure for a predicted bit value for each of the probabilistic bits to a level indicating that the predicted bit-value for each of the probabilistic bits is more likely than not to be correct.

6. The method of claim 5, wherein the step of setting the likelihood measure for the predicted bit value for each of the probabilistic bits includes setting to a value greater than 0.5 and less than 1.0, an a priori probability for the predicted bit value for each of the probabilistic bits.

7. The method of claim 6, further comprising:
identifying any remaining data bits that have not had a likelihood measure set for their value; and
setting to approximately 0.5, an a priori probability for an expected bit value for each of the remaining data bits;
wherein the step of decoding the currently received message includes decoding the currently received message utilizing:
the knowledge of the expected bit values of the identified deterministic data bits, with an a priori probability for the value of each deterministic data bit set to 1.0;
the knowledge of the predicted values of the identified probabilistic bits, with an a priori probability for the value of each probabilistic bit set to a high probability greater than 0.5 and less than 1.0; and
knowledge of the expected value of each of the remaining bits, with the a priori probability for the expected value of each remaining data bit set to approximately 0.5.

8. The method of claim 7, further comprising:
determining whether the decoding step was successful;
if the decoding step was successful, updating stored bit values in a memory;
if the decoding step was not successful, resetting to approximately 0.5, the a priori probability for the expected bit value for each of the probabilistic bits; and
attempting to decode the currently received message utilizing the a priori probability of approximately 0.5 for the expected bit value for each of the probabilistic bits.

9. The method of claim 8, further comprising:
determining whether the attempted decoding step was successful;
if the attempted decoding step was successful, updating the stored bit values in the memory;
if the attempted decoding step was not successful, resetting to approximately 0.5, the a priori probability for the expected bit values for all of the data bits; and
reattempting to decode the currently received message utilizing the a priori probability of approximately 0.5 for the expected bit values for all of the data bits.

10. The method of claim 9, further comprising:
determining whether the reattempted decoding step was successful;
if the reattempted decoding step was successful, updating the stored bit values in the memory;
if the reattempted decoding step was not successful, storing soft values of selected bits in the memory;
receiving a next frame containing an encoded message of the given type;
soft-combining the values of selected bits in the encoded message from the next frame with the stored soft values; and
decoding the encoded message from the next frame utilizing the soft-combined values of the selected bits.

11. The method of claim 10, wherein the soft-combining step includes:
selecting a segment of bits for soft combining, wherein the bits in the selected segment have values that remain unchanged or change predictably from frame-to-frame, but the values of these bits are not known.

12. A method in a radio receiver of decoding a frame containing a currently received encoded message of a given type, said method comprising:
determining whether messages of the given type were previously received and successfully decoded;
if messages of the given type were previously received and successfully decoded, analyzing data bits from header and data fields of the previously received and decoded messages to identify probabilistic data bits having expected bit values that are predictable in each subsequently received message with a high, but not absolute, degree of certainty, wherein each predictable data bit has a value that changes in each subsequently received message in a predictable manner;
predicting values of the probabilistic data bits for the currently received message; and
decoding the currently received message utilizing knowledge of the predicted values of the probabilistic data bits.

13. The method of claim 12, further comprising prior to decoding the currently received message, the step of setting a likelihood measure for an expected bit value for each of the probabilistic data bits to a level indicating that the expected bit value for each of the probabilistic data bits is more likely than not to be correct.

14. The method of claim 13, wherein the step of setting the likelihood measure for the expected bit value for each of the probabilistic data bits includes setting to a high probability greater than 0.5 and less than 1.0, an a priori probability for the expected bit value for each of the probabilistic data bits.

15. The method of claim 14, further comprising prior to decoding the currently received message frame, the steps of:
identifying any remaining data bits that have not had a probability set for their value; and
setting to approximately 0.5, an a priori probability for an expected bit value for each of the remaining data bits.

16. An arrangement in a radio receiver for decoding an encoded message of a given type in a currently received frame, said arrangement comprising:

means for determining whether messages of the given type were previously received and successfully decoded;

means, responsive to a determination that messages of the given type were previously received and successfully decoded, for analyzing data bits from header and data fields of the previously received and decoded messages to identify deterministic data bits having expected bit values that are determinable in the currently received message based on the decoded values of the bits in the previously received messages, said deterministic data bits including both consistent data bits, wherein each consistent data bit has a value that is unchanging in each of the previously received messages, and predictable data bits, wherein each predictable data bit has a value that changes in each subsequently received message in a predictable manner; and a decoder for decoding the currently received message utilizing knowledge of the expected bit values of the identified deterministic data bits.

17. The arrangement of claim 16, further comprising:

means for setting to 1.0, an a priori probability for an expected bit value for each of the deterministic data bits; and means for providing to the encoder, the a priori probability and the expected bit values for each of the deterministic data bits.

18. The arrangement of claim 17, wherein the means for analyzing the data bits from the previously received and decoded messages also includes means for identifying probabilistic data bits having expected bit values that are predictable in each subsequently received message with a high, but not absolute, degree of certainty, wherein each predictable data bit has a value that changes in each subsequently received message in a predictable manner:

wherein the arrangement further comprises means for predicting values of the probabilistic data bits for the currently received message, wherein the decoder decodes the currently received message utilizing the knowledge of the expected bit values of the identified deterministic data bits together with knowledge of the predicted values of the probabilistic data bits.

19. The arrangement of claim 18, further comprising:

means for setting to a high probability greater than 0.5 and less than 1.0, an a priori probability for an expected bit value for each of the probabilistic data bits; and means for providing to the encoder, the a priori probabilities and the expected bit values for each of the deterministic data bits and the probabilistic data bits.

20. The arrangement of claim 19, further comprising:

means for identifying any remaining data bits in the currently received message that have not had a probability set for their value;

means for setting to approximately 0.5, an a priori probability for an expected bit value for each of the remaining data bits; and means for providing to the encoder, the a priori probability and the expected bit value for each of the remaining data bits;

wherein the decoder decodes the currently received message utilizing:

the knowledge of the expected bit values of the identified deterministic data bits, with the a priori probability for the value of each deterministic data bit set to 1.0;

the knowledge of the predicted values of the probabilistic data bits, with the a priori probability for the value of each probabilistic data bit set-to-a high probability greater than 0.5 and less than 1.0; and knowledge of the expected value of each of the remaining bits, with the a priori probability for the expected value of each remaining data bit sst.to approximately 0.5.

21. The arrangement of claim 20, further comprising:

means for determining whether the decoder successfully decoded the currently received message;

means responsive to a determination that the decoder was successful, for updating stored bit values in a memory;

means responsive to a determination that the decoder was not successful, for resetting to approximately 0.5, the a priori probability for the expected bit value for each of the probabilistic data bits; and means for controlling the decoder to attempt a second decoding of the currently received message utilizing the a priori probability of approximately 0.5 for the expected bit value for each of the probabilistic data bits.

22. The arrangement of claim 21, wherein:

the means for determining whether the decoder successfully decoded the currently received message determines whether the second attempted decoding was successful;

the means for updating the stored bit values in the memory updates the stored bit values in the memory if the attempted second decoding was successful;

wherein the arrangement further comprises means, responsive to a determination that the attempted second decoding was not successful, for resetting to approximately 0.5, the a priori probability for the expected bit values for all of the data bits; and the means for controlling the decoder causes the decoder to attempt a third decoding of the currently received message utilizing the a priori probability of approximately 0.5 for the expected bit values for all of the data bits.

23. The arrangement of claim 22, wherein:

the means for determining whether the decoder successfully decoded the currently received message determines whether the third attempted decoding was successful;

the means for updating the stored bit values in the memory updates the stored bit values in the memory if the attempted third decoding was successful;

wherein the arrangement further comprises:

means, responsive to a determination that the attempted third decoding was not successful, for storing soft values of selected bits in the memory;

means for receiving a next frame containing an encoded message of the given type; and means for soft-combining the values of selected bits in the encoded message from the next frame with the stored soft values; and wherein the means for controlling the decoder causes the decoder to decode the encoded message from the next frame utilizing the soft-combined values of the selected bits.

24. The arrangement of claim 23, wherein the means for storing soft values of selected bits in the memory includes means for selecting a segment of bits for soft combining, wherein the bits in the selected segment have values that remain unchanged or change predictably from frame-to-frame, but the values of these bits are not known.

25. An arrangement in a radio receiver for decoding a message of a given type in a currently received frame, said arrangement comprising:

means for determining whether messages of the given type were previously received and successfully decoded;

means responsive to a determination that messages of the given type were previously received and successfully decoded, for analyzing data bits from header and data fields of the previously received and decoded messages to -identify probabilistic data bits having expected bit values that are predictable in each subsequently received message with a high, but not absolute, degree of certainty;

means for predicting values of the probabilistic data bits for the currently received message; and a decoder for decoding the currently received message utilizing knowledge of the predicted values of the probabilistic data bits.

26. The arrangement of claim 25, further comprising:

means for setting to a high probability greater than 0.5 and less than 1.0, an a priori probability for an expected bit value for each of the probabilistic data bits; and means for providing to the encoder, the a priori probability and the predicted bit value for each of the probabilistic data bits.

27. The arrangement of claim 26, further comprising:

means for identifying any remaining data bits in the currently received message that have not had a probability set for their value; and means for setting to approximately 0.5, an a priori probability for an expected bit value for each of the remaining data bits;

wherein the means for providing to the encoder, the a priori probability and the predicted bit value for each of the probabilistic data bits also provides to the encoder, the a priori probability and expected bit value for each of the remaining data bits.

* * * * *

UNITED STATES PATENT AND TRADEMARK OFFICE
CERTIFICATE OF CORRECTION

| | | |
|---|---|---|
| PATENT NO. | : 8,155,247 B2 | Page 1 of 1 |
| APPLICATION NO. | : 12/063997 | |
| DATED | : April 10, 2012 | |
| INVENTOR(S) | : Koorapaty et al. | |

It is certified that error appears in the above-identified patent and that said Letters Patent is hereby corrected as shown below:

In Column 1, Line 27, delete "(CINR)" and insert -- (CINRs) --, therefor.

In Column 5, Line 5, delete "some," and insert -- some --, therefor.

In Column 6, Line 61, delete "a," and insert -- a --, therefor.

In Column 9, Line 17, in Claim 4, delete "chanqes" and insert -- changes --, therefor.

In Column 11, Line 66, in Claim 20, delete "set-to-a" and insert -- set to a --, therefor.

In Column 12, Line 3, in Claim 20, delete "sst.to" and insert -- set to --, therefor.

In Column 12, Line 7, in Claim 21, delete "means" and insert -- means, --, therefor.

In Column 12, Line 9, in Claim 21, delete "means" and insert -- means, --, therefor.

Signed and Sealed this
Twenty-first Day of August, 2012

David J. Kappos
*Director of the United States Patent and Trademark Office*